US006791344B2

(12) United States Patent
Cook et al.

(10) Patent No.: US 6,791,344 B2
(45) Date of Patent: Sep. 14, 2004

(54) SYSTEM FOR AND METHOD OF TESTING A MICROELECTRONIC DEVICE USING A DUAL PROBE TECHNIQUE

(75) Inventors: Donald J. Cook, Essex Junction, VT (US); Harvey Allard, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 118 days.

(21) Appl. No.: 09/751,355

(22) Filed: Dec. 28, 2000

(65) Prior Publication Data

US 2002/0084795 A1 Jul. 4, 2002

(51) Int. Cl.[7] .............................................. G01R 31/02
(52) U.S. Cl. ................................. 324/754; 324/158.1
(58) Field of Search ................................ 324/754, 755, 324/757, 758, 761, 762, 158.1, 537, 765

(56) References Cited

U.S. PATENT DOCUMENTS

| | | | |
|---|---|---|---|
| 4,038,599 A | * 7/1977 | Bove et al. | 324/754 |
| 4,383,217 A | 5/1983 | Shiell | 324/158 |
| 4,423,373 A | * 12/1983 | LeCroy, Jr. | 324/72.5 |
| 4,764,026 A | 8/1988 | Powell et al. | 374/178 |
| 5,057,772 A | 10/1991 | Bruno et al. | 324/158 |
| 5,151,651 A | * 9/1992 | Shibata | 324/754 |
| 5,214,389 A | 5/1993 | Cao et al. | 324/719 |
| 5,217,907 A | 6/1993 | Bulucea et al. | 437/8 |
| 5,436,571 A | 7/1995 | Karasawa | 324/765 |
| 5,914,611 A | 6/1999 | Cheng | 324/719 |
| 5,914,613 A | 6/1999 | Gleason et al. | 324/754 |
| 5,923,178 A | 7/1999 | Higgins et al. | 324/754 |
| 5,933,309 A | 8/1999 | Smith | 361/88 |
| 5,982,183 A | 11/1999 | Sano | 324/754 |
| 5,999,002 A | 12/1999 | Fasnacht et al. | 324/525 |
| 6,023,171 A | * 2/2000 | Boyette et al. | 324/754 |
| 6,100,815 A | * 8/2000 | Pailthorp | 324/754 |
| 6,160,409 A | * 12/2000 | Nurioka | 324/754 |
| 6,181,144 B1 | * 1/2001 | Hembree et al. | 324/754 |

FOREIGN PATENT DOCUMENTS

| | | | |
|---|---|---|---|
| JP | 11064385 | 3/1999 | 1/73 |
| JP | 11133075 | 5/1999 | 27/2 |

OTHER PUBLICATIONS

Hewlett Packard, HP 4155B/4156B Semiconductor Parameter Analyzer, Product Note–3, Prober Connection Guide, pp. 1–21.

* cited by examiner

Primary Examiner—Ernest Karlsen
Assistant Examiner—Russell M. Kobert
(74) Attorney, Agent, or Firm—Downs Rachlin Martin PLLC

(57) ABSTRACT

A system (10) for and method of testing a device under test (DUT) (12) having a plurality of probe pads (14) utilizing a dual probe technique to overcome contact resistance that may be present. The system comprises a plurality of sensing probes (30) and a plurality of forcing probes (32) arranged in pairs consisting of one sensing probe and one forcing probe. Each pair of sensing and forcing probes is provided for contacting one of the probe pads on the DUT. Each forcing probe is in electrical communication with a power supply (20) via a switching matrix (24), and each sensing probe is in electrical communication with a voltage meter (52) via the switching matrix. During testing, at least one of the power supplies provides a voltage to a corresponding forcing probe in contact with a particular probe pad. The sensing electrode at that particular probe pad senses a voltage, which is measured by the voltmeter and is used by a feedback controller (56) to adjust the voltage supplied by the corresponding power supply to the forcing probe.

17 Claims, 2 Drawing Sheets

SYSTEM FOR AND METHOD OF TESTING A MICROELECTRONIC DEVICE USING A DUAL PROBE TECHNIQUE

FIELD OF INVENTION

The present invention relates generally to the field of post-manufacturing testing of microelectronic devices. More particularly, the present invention is directed to a system for and method of testing a microelectronic device using probe card having two probes for contacting each contact pad of the microelectronic device.

BACKGROUND OF THE INVENTION

As manufacturers continually reduce the size of microelectronic devices contained in very large scale integration (VLSI) integrated circuits (ICs), it is becoming more difficult to test these devices to determine whether or not they function properly. This is so because as the size of the devices decreases, the electrical resistance through these devices also decreases. Therefore, the sensitivity of the test measurements, and, relatedly, accuracy of the electrical signals reaching the devices during testing, must increase accordingly.

However, the use of copper-based metallurgy in microelectronic devices increases the difficulty of providing the devices with an accurate signal. Unlike test connections made to the aluminum probe pads of microelectronic devices having aluminum-based metallurgy, test connections made to copper probe pads are problematic due to the formation of layers of copper oxide on the probe pads and the test probes. These copper oxide layers increase the contact resistance between the test probes and probe pads, decreasing the voltage applied across the devices. The reduction in voltage decreases the accuracy and sensitivity of the measurements made during testing and often leads to false failure determinations.

The resistance caused by the layers of copper oxide and other materials is commonly referred to as "contamination resistance." Various systems and methods have been developed for measuring contamination resistance. For example, Japanese Publication No. 11-133075 is directed to a system for and method of determining whether or not the contamination resistance of one or more probe pads is too large to obtain useful measurement data from a device wider test (DUT). The system comprises a probe card having a plurality of probes, or needles, for testing a DUT having a plurality of probe pads. The probe card provides a pair of probes for contacting each probe pad of the DUT. The pair of probes associated with each probe pad are spaced from one another and contact the cones on be ad at different locations.

The resistance caused by the layers of copper oxide and other materials is commonly referred to as contamination resistance. Various systems and methods have been developed for measuring contamination resistance. For example, Japanese Publication No. 11-133075 is directed to a system for and method of determining whether or not the contamination resistance of one or more probe pads is too large to obtain useful measurement data from a device under test (DUT). The system comprises a probe card having a plurality of probes, or needles, for testing a device under test (DUT) having a plurality of probe pads. The probe card provides a pair of probes for contacting each probe pad of the DUT. The pair of probes associated with each probe pad are spaced from one another and contact the corresponding probe pad at different locations.

The method disclosed in Japanese Publication No. 11-133075 includes passing a current via the pair of probes through the probe pad to determine the contact resistance, which is substantially equal to the contamination resistance. If the contact resistance is higher than a predetermined value, further testing of the DUT does not take place, since any measurement made in the presence of the excessive contact resistance would fall outside the acceptable range. A drawback of this method is that testing is a two-stage process. First, the Kelvin testing is performed on each probe pad to determine the level of contamination resistance. Then, if the results of the Kelvin probing are satisfactory, testing of the devices in the DUT proceeds. Another drawback of the method is that the determination made is only binary. Further testing is either performed or not based upon the magnitude of the contact resistance.

A similar method of checking contact resistance during testing of a DUT is disclosed in U.S. Pat. No. 5,999,002 to Fasnacht et al. Fasnacht et al. disclose that contact resistance may be measured using a Kelvin connection and an impulse pulse generated by a transformer driven by a microprocessor. Although Fasnacht et al. state that contact resistance testing may be made concurrently with testing of the IC contained within the DUT, similar to the method disclosed in Japanese Publication No. 11-133075, the results are still binary. Either the contact resistance is too high and testing of the IC produces false results or contact resistance is within an acceptable range and testing of the IC produces acceptable results.

SUMMARY OF THE INVENTION

In one aspect, the present invention is directed to a system for testing a DUT having a plurality of probe pads. The system comprises a forcing probe for contacting and applying a first electrical signal to a first one of the plurality of probe pads. A sensing probe is provided for contacting the first one of the plurality of probe pads and sensing a second electrical signal at the first one of the plurality of probe pads. A variable power supply is in electrical communication with the forcing probe and the sensing probe. The variable power supply is capable of adjusting the first electrical signal based upon the second electrical signal.

In another aspect, the present invention is directed to a method of testing a DUT having a plurality of probe pads. The method includes the steps of providing a first electrical signal to one of the plurality of probe pads. A second electrical signal is then sensed at the one of the plurality of probe pads. The first electrical signal is adjusted based upon the second electrical signal.

BRIEF DESCRIPTION OF THE DRAWINGS

For the purpose of illustrating the invention, the drawings show forms of the invention that are presently preferred. However, it should be understood that the present invention is not limited to the precise arrangements and instrumentalities shown in the drawings.

DETAILED DESCRIPTION OF THE INVENTION

Figure 1:
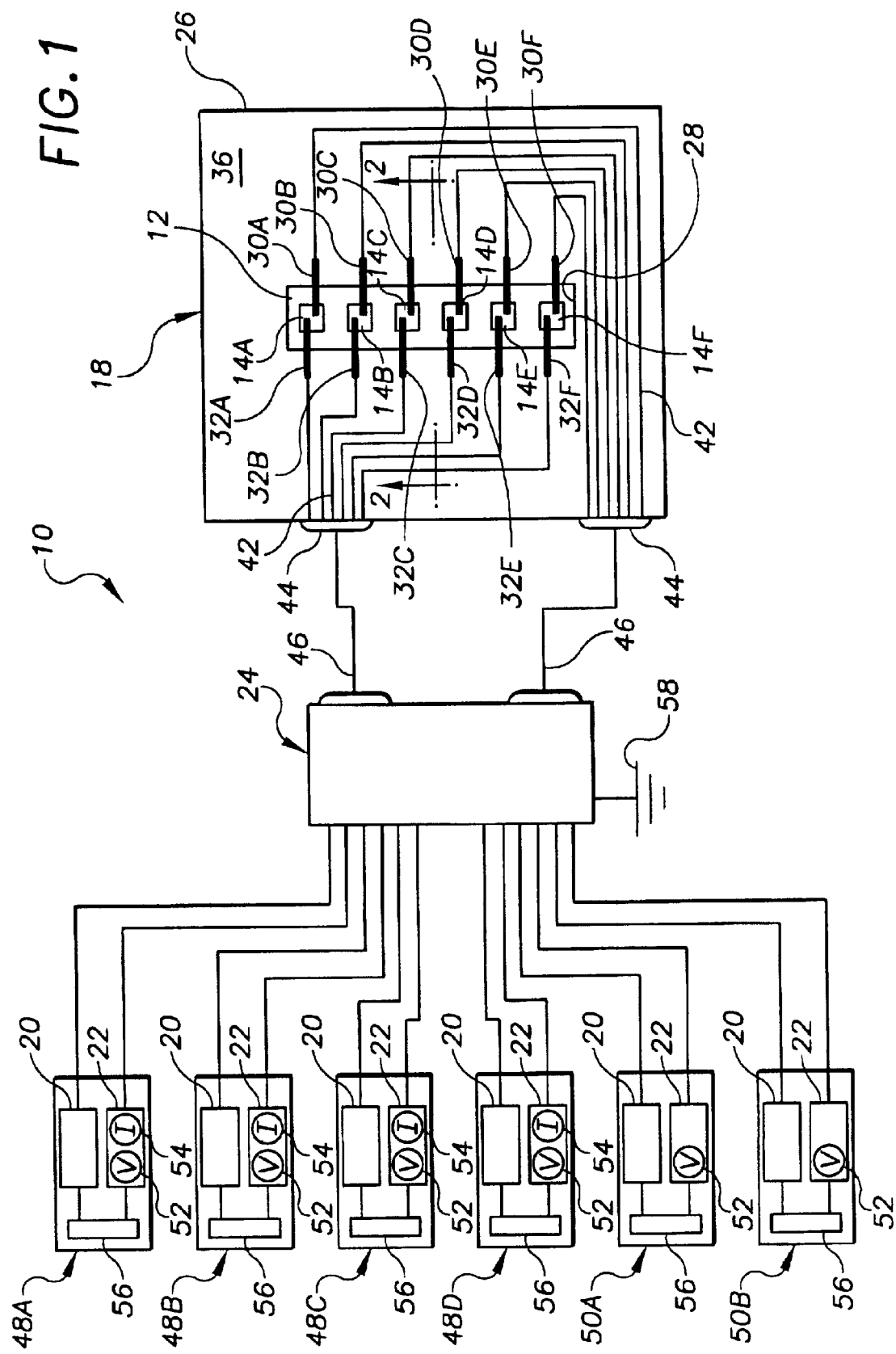
FIG. 1 is a schematic view of a microelectronic device testing system according to the present invention.
Figure 2:
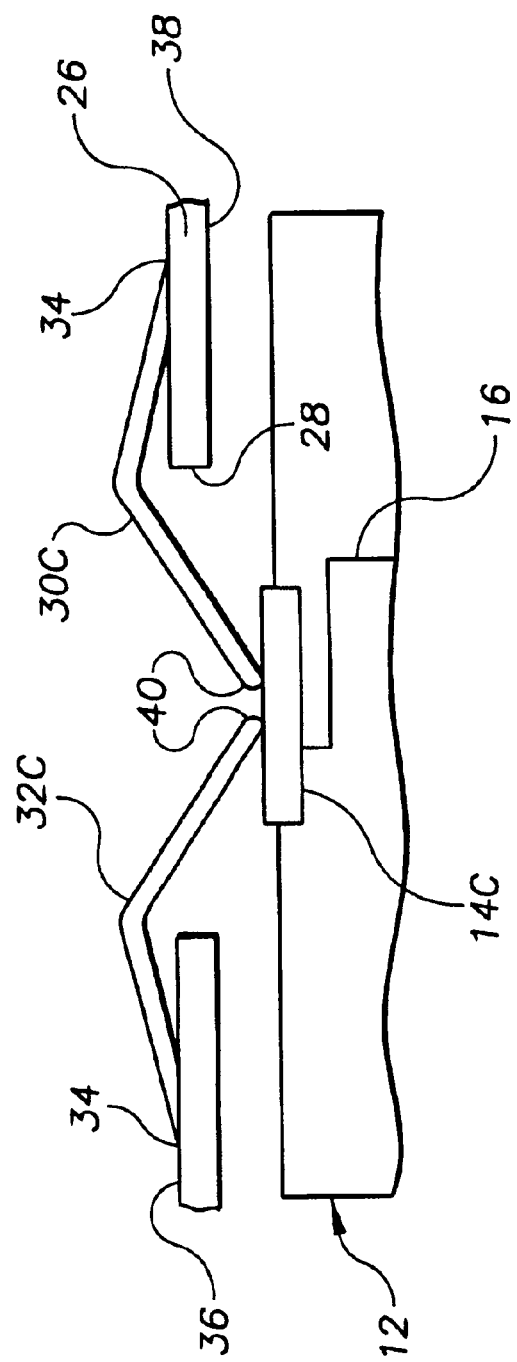
FIG. 2 is a cross-sectional view of the probe card and DUT as taken along line 2—2 of FIG. 1.

Referring now to the drawings, wherein like numerals indicate like elements, FIGS. 1 and 2 illustrate in accordance with the present invention a system 10 for testing a device under test (DUT) 12 following manufacture of the DUT to determine whether or not the ICs (not shown) and/or particular microelectronic devices aboard the DUT function within design tolerances. As described below, system 10 allows DUT 12 to be tested under design power conditions and without the need to test each probe pad 14A–F to determine whether or not the contact resistance at each probe pad is within an acceptable range prior to performing operational testing of the DUT.

DUT 12 comprises a plurality of probe pads 14A–F, which permit testing of the various microelectronic devices (not shown) contained within the DUT. DUT 12 may be a semiconductor- and/or superconductor-based device comprising any one or more of various microelectronic devices such as memory (e.g., DRAM or SRAM) and logic (e.g., ASICs, microcontrollers, microprocessors, and FPGAs), among others. Preferably, DUT 12 is tested while it is a die on a wafer (not shown). However, DUT may be tested after dicing. System 10 is particularly suited for use with microelectronic devices having copper-based metallurgy, which is readily subject to test degradation due to buildup of copper oxide films on probe pads as well as test probes. However, system 12 may be used to test microelectronic devices utilizing conductors made of other materials, such as aluminum.

In the embodiment shown, probe pads 14A–F are arranged in a linear array. However, probe pads 14A–F may be arranged in any configuration suited to the particular architecture of DUT 12. Probe pads 14A–F are connected to the various structures contained in DUT 12 by wires 16 (FIG. 2) formed within DUT during manufacturing. One skilled in the art will appreciate the variety of types and structures of DUTs that may be tested using a system of the present invention.

System 10 generally comprises a probe card 18, a plurality of power supplies 20, a plurality of sensing instruments 22 and a switch matrix 24 connecting the probe card to the power supplies and sensing instruments. Probe card 18 comprises a substrate 26 having an opening 28 through which extend a plurality of sensing probes 30A–F and a plurality of forcing probes 32A–F. Sensing and forcing probes 30A–F, 32A–F are preferably made of tungsten or other suitable refractory metals and alloys thereof, and are attached at their proximal ends 34 (FIG. 2) to substrate 26 at upper surface 36. In alternative embodiments, probes 30A–F, 32A–F may be attached to lower surface 38 of substrate 26. Sensing and forcing probes 30A–F, 32A–F cantilever first toward and then through opening 28 such that when the sensing and forcing probes are in contact with one or more corresponding probe pads 14A–F, lower surface 38 of substrate 26 is spaced from DUT 12.

Each pair of substantially opposing sensing and forcing probes 30A–F, 32A–F contacts a corresponding probe pad 14A–F during testing of DUT 12. Accordingly, distal ends 40 of substantially opposing sensing and forcing probes 30A–F, 32A–F are located proximate one another but are separated by a sufficient distance such that they do not contact one another at any time, and particularly when brought into contact with probe pad 14 when the contact force between the probes and the probe pads may tend to cause the distal ends of the probes to displace toward one another.

Each probe 30A–F, 32A–F is in electrical communication with a wire conductor 42 patterned onto the upper surface 36 of substrate 26. Conductors 42 connect probes 30A–F, 32A–F to a corresponding one of a pair of interface connection points 44, each of which is in electrical communication with switch matrix 24 via a parallel conductor cable 46 containing an electrically isolated conductor for each corresponding forcing probe or sensing probe. Although probes 30A–F, 32A–F are connected to switch matrix 24 in the manner shown, one skilled in the are will appreciate the variety of ways of electrically interconnecting the probes 30A–F, 32A–F and switch matrix 24 such that each probe has a dedicated connection to the switch matrix.

Sensing probes 30A–F and forcing probes 32A–F are suitably arranged in a pair of linear arrays to match the linear array of probe pads 14A–F. One skilled in the art will recognize that sensing probes 30 and forcing probes 32 may be arranged in any configuration that suits the arrangement of corresponding probe pad 14. In addition, although probes 30A–F, 32A–F are shown as being needle-type probes, they may be other types of probes, such as vane probes or whisker probes. In a presently preferred embodiment, probe card 18 comprises a 1×25 linear array of sensing probes 30 and a 1×25 linear array of forcing probes 32. However, for clarity and simplicity, probe card is shown containing only a 1×6 linear array of sensing probes 30A–F and a 1×6 linear array of forcing probes 32A–F. One skilled in the art will recognize that any number of sensing probes 30 and forcing probes 32 may be provided.

In the embodiment of system 10 shown in FIG. 1, power supplies 20 and sensing instruments 22 are preferably grouped into four source measurement units (SMUs) 48A–D and two voltage supply units (VSUs) 50A–B. Each SMU 48 comprises one power supply 20 and one sensing instrument 22 that contains a voltmeter 52 and a current meter 54. Each VSU 50 comprises one power supply 20 and one sensing instrument 22 that contain one voltmeter 52. Each SMU 48A–D and VSU 50A–B contains a feedback controller 56 for allowing each power supply 20 to provide a variable strength output signal to a corresponding one of the forcing probes 32A–F. The strength of the output signal from each power supply 20 is dependent upon the magnitude of the voltage measured by corresponding voltmeter 52 contained in the same SMU 48A–D or VSU 50A–B. The functions of SMUs 48A–D and VSUs 50A–B are more particularly described below in connection with a description of the operation of system 10.

In a preferred embodiment, which is generally illustrated in FIG. 1, SMUs 48A–D and VSUs 50A–B may form a single equipment package, such as a Semiconductor Parameter Analyzer model no. HP4155B available from Hewlett Packard, Palo Alto, Calif. Although power supplies 20, sensing instruments 22 and feedback controllers 56 are grouped as SMUs 48A–D and VSUs 50A–B, one skilled in art will understand that these components may be stand-alone components connected to one another either directly or through one or more other components, such as a system controller (not shown), e.g., a central processing unit, to provide the necessary functions described below. In addition, one skilled in the art will appreciate that the particular numbers of SMUs 48 and VSUs 50 shown are illustrative only. Any number of SMUs 48 and VSUs 50 may be used to suit a particular application.

Each power supply 20 and each sensing instrument 22 is independently connected to switch matrix 24, which allows each probe 30A–F, 32A–F to be connected to one of the power supplies, and one of the sensing instruments or ground 58 as required by a particular test. One skilled in the art will readily understand the structure, operation and function of switch matrix 24, and thus these aspects need not be described in detail herein. In a preferred embodiment, switch matrix may be a Keithley Model No. 707 available from Keithley Instruments Inc., Cleveland, Ohio. If system 10 is not configurable, i.e., each probe 30A–F, 32A–F is permanently connected to a particular power supply 20, sensing instrument 22 or ground 58, switch matrix 24 may be eliminated from the system.

The function of SMUs 48A–D and VSUs 50A–B will become readily apparent in light of the following example. In this example, DUT 12 contains a plurality of FETs (not shown) and other microelectronic devices (not shown). As known to those skilled in the art, an FET is generally characterized as a four terminal device. These four terminals are: (1) a drain; (2) a source; (3) a gate; and (4) a substrate. During testing, it is desirable to test an FET at conditions as close as practicable to the conditions it will experience during normal operation of the DUT 12 when installed in its intended operating environment. Accordingly, the performance of FET should be modeled as accurately as possible with respect to design/operating conditions.

One test that may be performed on the FET under test is to measure the channel current between the source and drain at various gate and substrate bias voltages while the bias voltages at the source and drain remain constant. In this manner, a performance graph of channel current versus gate voltage may be obtained.

To perform such a test, probe pads 14A–F of DUT 12 are connected to the following terminals: probe pad 14A is connected to the drain of the FET under test; probe pad 14B is connected to the source of the FET under test; probe pad 14C is connected to the gate of the FET under test; probe pad 14D is connected to the substrate of FET under test; probe pad 14E is connected to the gate of an FET adjacent the FET under test; and probe pad 14F is connected to the drain of the FET adjacent the FET under test. Accordingly, to test the FET under test, probe card 18 is moved toward DUT 12 until probes 30A–F, 32A–F contact the respective probe pads 14A–F, and switch matrix 24 is configured so that: SMU 48A is in electrical communication with probe pad 14A; SMU 48B is in electrical communication with probe pad 14B; SMU 48C is in electrical communication with probe pad 14C; SMU 48D is in electrical communication with probe pad 14D; VSU 50A is in electrical communication with probe pad 14E; and VSU 50B is in electrical communication with probe pad 14F.

When switch matrix 24 has been properly set, a test upon DUT 12 to measure the performance of the FET under test may be performed as follows. In this example, each of the bias voltages and ranges of bias voltages experienced by the particular element of the FET under test is equivalent to the corresponding design voltage or range of voltage for that particular element. During the test, it is desired accomplish the following: bias the drain of the FET under test at +2 volts; ground the source of the FET under test so that it remains at zero volts; bias the gate of the FET under test in a range of 0 volts to +2 volts in ½ volt increments; bias the substrate of the FET under test in a range of 0 volts to −2 volts in ½ volt increments in sync with the biasing of the gate; bias the gate of the FET adjacent the FET under test to +10 volts, which closes the gate of the adjacent FET; ground the drain of the FET adjacent the FET under test; and measure the channel current of the FET under test at each of the foregoing ½ volt increments.

To begin the test, power supply 20 of SMU 48A is energized. At first, a low power forcing signal is sent to corresponding forcing probe 32A in contact with probe pad 14A such that the voltage sensed at sensing probe 30A in contact with probe pad 14A by voltmeter 52 of of SMU 48A is less than +2 volts. Feedback controller 56 within SMU 48A sends a feedback signal to power supply 20 of SMU 48A that increases the magnitude of the forcing signal sent to forcing probe 14A. The feedback process continues until voltage meter 20 of SMU 48A indicates a voltage of +2 volts. Depending upon the amount of contact resistance between forcing probe 32A and probe pad 14A due to contamination on the probe pad or the forcing probe, the actual voltage applied to the forcing probe may be in a range of just over +2 volts to about +4 volts. The impedance of the sensing probe 30A, however, is relatively large, e.g., and is typically on the order of 106 ohms. Such a high impedance renders the contact resistance between probe pad 14A and sensing probe 30A negligible. Thus, when the voltage measured at voltmeter 52 of SMU 48A is +2 volts, the drain of the FET under test is biased at substantially +2 volts. This voltage is held constant during the entire test.

Power supply 20 of SMU 48B, and therefore forcing probe 32B and the source of the FET under test, is grounded, e.g., to ground 58. Thus, the voltage measured at voltmeter 52 of SMU 48B is zero. Ground at the source of the FET under test is maintained during the entire test. Power supplies 20 of SMUs 48C, 48D are energized in a manner similar to the power supply of SMU 48A, except to different voltages. That is, the voltages at sensing probes 30C, 30D are measured at corresponding voltmeters 52 of SMUs 48C, 48D and forcing signals from corresponding power supplies 20 are adjusted accordingly via feedback from the voltmeters. Feedback adjustment of the forcing signals is performed for each ½ volt increment in the desired range. In this manner, the gate and substrate of FET under test are biased in substantially the desired ½ volt increments.

Similar to power supply 20 of SMU 48A, the power supply of VSU 50A is energized and adjusted via corresponding feedback controller 56 based upon a signal from voltmeter 52 contained in VSU 50A until the voltage measured by the voltmeter is +10 volts. In this manner, the gate of the FET adjacent the FET under test is biased to +10 volts to close the gate. The +10 volt bias is maintained during the entire testing of DUT 12. Power supply 20 of VSU 50B is grounded, e.g., to ground 58 during the test. Grounding power supply 20 of VSU 50B maintains the drain of adjacent gate at zero volts to reduce noise in the measured signals.

As mentioned above, the goal of the test of the present example is to measure the channel current in the FET at ½ volt increments in the bias voltages applied to the gate and substrate of FET. Thus, at each ½ volt increment, one, the other or both current meters 54 of SMUs 48A, 48B may be used to measure the channel current from the source of the FET under test to the drain of the FET under test.

As will be understood by one skilled in the art, each SMu 48 not used to measure current could be replaced with a VSU 50 or a variable power supply that does not have a voltmeter. Also, all VSUs 50 could be replaced with SMUs 48 such that system 10 only includes SMUs, although this may unnecessarily increase the total cost of the system. All that is required under the present invention is that each pair of forcing probes 32 and sensing probes 30 used to apply a particular voltage be in suitable electrical communication with a variable power supply capable of adjusting the magnitude of the electrical signal applied to the respective forcing probe based upon a signal sensed at corresponding sensing probe.

While system 10 has been described in the context of testing an FET in a DUT 12, the invention is not so limited.

System 10 is particularly suited for testing elements of any microelectronic device where probe pad contact resistance may adversely affect test results, e.g., where the elements, such as abi-polar devices, tested have relatively low resistance and, therefore, draw a relatively high current. Such elements may be part of any of a number of microelectronic devices, such as the logic devices and memory devices mentioned above.

While the present invention has been described in connection with preferred embodiments, it will be understood that it is not so limited. On the contrary, it is intended to cover all alternatives, modifications and equivalents as may be included within the spirit and scope of the invention as defined in the appended claims.

What is claimed is:

1. A system for testing a DUT having a plurality of probe pads, comprising:
   a. a forcing probe for contacting and applying an electrical signal to a first portion of a first one of the plurality of probe pads;
   b. a sensing probe for contacting a second portion of said first one of the plurality of probe pads spaced from said first portion and sensing said electrical signal after said electrical signal has passed from said first portion to said second portion via said first one of said plurality of probe pads; and
   c. a feedback system operatively configured for adjusting the magnitude of said electrical signal applied by said forcing probe as a function of said electrical signal sensed at said sensing probe so as to achieve a desired value of said electrical signal at said second portion.

2. A system according to claim 1, further comprising a plurality of forcing probes and a plurality of feedback systems, each of said forcing probes being in electrical communication with a corresponding one of said plurality of feedback systems.

3. A system according to claim 1, wherein said feedback system includes a voltmeter for measuring said electrical signal.

4. A system according to claim 1, further comprising a probe card, said probe card supporting said forcing probe and said sensing probe.

5. A system according to claim 1, further comprising first and second sensing electrodes and a sensing instrument, said first sensing electrode in electrical communication with said feedback system, said second sensing electrode in electrical communication with said sensing instrument.

6. A system according to claim 5 wherein said sensing instrument is a current meter.

7. A system according to claim 1, further comprising a plurality of forcing probes, a plurality of feedback systems and a switching matrix, said plurality of forcing probes being selectively connectable to said plurality of feedback systems via said switching matrix.

8. A system according to claim 1, wherein said feedback system includes a feedback controller operatively configured for automatically achieving said desired value of said electrical signal.

9. A method of testing a DUT having a plurality of probe pads, comprising the steps of:
   a. providing a first electrical signal to a first portion of one of the plurality of probe pads;
   b. sensing said first electrical signal at a second portion of said one of the plurality of probe pads spaced from said first portion after said first electrical signal has passed through said one of the plurality of probe pads; and
   c. adjusting the magnitude of said first electrical signal applied to said first portion as a function of said first electrical signal as sensed at said second portion so as to achieve a desired value of said first electrical signal as sensed at said second portion.

10. A method according to claim 9, further comprising the step of measuring a second electrical signal at a second one of the plurality of probe pads when said first electrical signal sensed at said second portion is equal to said desired value.

11. A method according to claim 9, comprising the steps of:
   a. providing a plurality of first electrical signals to a number of the plurality of probe pads;
   b. sensing said plurality of first electrical signals at said number of the plurality of the probe pads; and
   adjusting said plurality of first electrical signals provided based upon corresponding ones of said plurality of first electrical signals sensed.

12. A method according to claim 11, wherein said plurality of first electrical signals is provided via a plurality of forcing probes and a plurality of power supplies each in electrical communication with a corresponding one of said plurality of forcing probes.

13. A method according to claim 12, farther comprising the step of selectively coupling said forcing probes to said power supplies via a switching matrix.

14. A method according to claim 12, wherein each or said power supplies includes a feedback system for adjusting a corresponding one of said plurality of first electrical signals sensed at said second portion of said one of the plurality of probe pads to a corresponding desired value.

15. A method according to claim 9, wherein said first electrical signal is provided via a forcing probe and a power supply in electrical communication with said forcing probe.

16. A method according to claim 15, further comprising a sensing probe and wherein said power supply includes a feedback system for adjusting the magnitude said first electrical signal applied by said forcing probe to said first portion of said one of the plurality of probe pads based upon said first electrical signal sensed by said sensing probe at said second portion of said one of the plurality of probe pads.

17. A method according to claim 9, further comprising the step of providing a feedback signal in proportion to said first electrical signal sensed at said second portion of said one of the plurality of probe pads for adjusting said first electrical signal applied at said first portion of said one of the plurality of probe pads.

* * * * *